(12) United States Patent
Linder et al.

(10) Patent No.: US 11,373,720 B2
(45) Date of Patent: Jun. 28, 2022

(54) ANALOG MEMORY CELLS WITH VALID FLAG

(71) Applicant: Octavo Systems LLC, Sugar Land, TX (US)

(72) Inventors: Peter Linder, Sugar Land, TX (US); Laurence Ray Simar, Jr., Richmond, TX (US); Erik James Welsh, Bellaire, TX (US); Gene Alan Frantz, Sugar Land, TX (US)

(73) Assignee: OCTAVO SYSTEMS LLC, Sugar Land, TX (US)

( * ) Notice: Subject to any disclaimer, the term of this patent is extended or adjusted under 35 U.S.C. 154(b) by 0 days.

(21) Appl. No.: 16/975,066

(22) PCT Filed: Feb. 22, 2019

(86) PCT No.: PCT/US2019/019242
§ 371 (c)(1),
(2) Date: Aug. 21, 2020

(87) PCT Pub. No.: WO2019/165272
PCT Pub. Date: Aug. 29, 2019

(65) Prior Publication Data
US 2020/0402601 A1    Dec. 24, 2020

Related U.S. Application Data

(60) Provisional application No. 62/634,695, filed on Feb. 23, 2018.

(51) Int. Cl.
*G11C 27/02* (2006.01)
*G11C 27/00* (2006.01)

(52) U.S. Cl.
CPC .......... *G11C 27/024* (2013.01); *G11C 27/005* (2013.01)

(58) Field of Classification Search
CPC ............................ G11C 27/024; G11C 27/005
See application file for complete search history.

(56) References Cited

U.S. PATENT DOCUMENTS

| | | | |
|---|---|---|---|
| 4,910,706 A | 3/1990 | Hyatt | |
| 5,638,320 A * | 6/1997 | Wong | G11C 11/5621 365/185.03 |
| 5,862,070 A * | 1/1999 | Shou | G06G 7/22 708/820 |
| 6,693,828 B1 * | 2/2004 | Blyth | G11C 16/28 365/185.2 |
| 9,977,711 B2 * | 5/2018 | Park | G06F 11/1048 |
| 2016/0313445 A1 | 10/2016 | Bailey et al. | |

FOREIGN PATENT DOCUMENTS

EP        1202287 B1    5/2012

OTHER PUBLICATIONS

International Search Report and Written Opinion issued in Application No. PCT/US19/019242, dated Jun. 24, 2019, 9 pages.

* cited by examiner

*Primary Examiner* — Vanthu T Nguyen
(74) *Attorney, Agent, or Firm* — Rothwell, Figg, Ernst & Manbeck, P.C.

(57) ABSTRACT

The present disclosure describes analog memories for use in a computer, such as a computer using a combination of analog and digital components/elements used in a cohesive manner.

13 Claims, 14 Drawing Sheets

ANALOG MEMORY CELLS WITH VALID FLAG

CROSS REFERENCE TO RELATED APPLICATION(S)

This application is a 35 U.S.C. § 371 National Stage of International Patent Application No. PCT/US2019/019242, filed Feb. 22, 2019, designating the United States and claiming priority to U.S. Provisional Application No. 62/634,695, filed on Feb. 23, 2018. The above identified applications are incorporated by reference.

TECHNICAL FIELD

Aspects of the present disclosure relate to analog memories, and in some aspects, use of such memories in mixed signal computers with both analog and digital elements.

BACKGROUND

In today's world, most computing is performed using digital computers. But before the digital computer became the dominant method of computing, the analog computer was the primary mechanism to handle real time signal processing, to tally numbers, and to predict the behavior of real world signals. In such systems, the analog computer components were configured and initialized by a combination of manual, mechanical, and electrical means; after configuration, the computation was initiated, and then the analog computer was allowed to run uncontrolled until some later time at which it was either stopped, or it came to stop on its own. Each configuration was unique and used to solve a specific problem or perform a specific function.

In electrical analog computers, the voltages at various nodes in the computer may represent real world characteristics, such as altitude, which are being simulated. In some instances, electro-mechanical means such as potentiometers may be used to set voltages for the initial conditions, and measurement equipment used to measure various voltages to serve as the simulation or computation output.

There remains a need for analog memories that may be used in more general applications, including mixed signal computing and reprogrammable analog applications.

SUMMARY

Unlike digital computers today, analog computers have not utilized the concept of storing in their native form the input or output data represented by voltages (or currents or charges). Hence, there is no wide-spread concept of an analog memory in the sense that digital memory is used today. Moreover, presently, there is no mechanism to indicate whether a voltage stored on a capacitor or other "capture and hold" circuit storing a signal has decayed away beyond valid usability.

According to some embodiments, an analog word is provided. Whereas a digital word may refer to a group of bits stored in a digital memory, taken either from a digital input or sampled analog signal, an analog word may comprise an analog signal stored as a value in a node of an analog memory. For instance, in some aspects, a single analog memory cell may differ from a digital bit in that the analog memory cell may store an entire analog word (much like a group of bits may represent a digital value). In some embodiments, a number of analog cells, each storing an analog word, may be arranged in a memory block or array.

According to some embodiments, a computer, such as a mixed signal computer, may utilize one or more memories, memory cells, or methods of storing an analog signal. The memory may include functionality, for instance in the form of circuitry, which compares stored analog data to reference data in order to generate an indication of the validity, degree of validity, and/or lack of validity of the stored analog data. In one or more embodiments, a method may be included which utilizes a validity signal to restore or refresh the analog data (and in some instances, the reference data) when sufficient data degradation in the stored reference data is detected. This may be done, for example, by comparison to a fixed value. In some embodiments, a computer may utilize one or more memories, memory cells, or methods of storing an analog signal in both analog and digital formats, with appropriate conversion and synchronization between these two formats.

According to some embodiments, an analog memory is provided that comprises a first memory element configured to store an analog data value and a second memory element configured to store a reference value. The reference value may be, for instance, an analog reference value stored simultaneously with the analog data value, which indicates decay—and in some instances validity—regarding the data value. The analog memory may be, for example, a memory cell, memory block, memory bucket-brigade, or memory accumulator. According to certain aspects, the first and second memory elements may each comprise circuitry suitable for storing an analog signal, and in some instances, the analog data value may be stored as a voltage in a capacitor or a charge on a transistor gate. The analog memory may additionally comprise one or more threshold sense blocks for comparing the stored reference value and a fixed reference value, and that comparison may be responsive to a control signal. In this case, the memory may be configured to provide an indicator when the comparison differs by less than a first amount, such that the indicator is a signal that indicates that the stored data value is suitable for further use, for instance, by subsequent processing blocks. Similarly, an indicator could indicate that the value differs by more than a given amount and/or is not suitable for subsequent use. In some embodiments, the threshold is 25% of the original value or difference from the fixed reference.

According to some embodiments, a multiply unit may be included. For instance, a multiply unit may be configured to refresh a stored data value by multiplying the data value by an amount based on a comparison of the stored reference value and the fixed reference value. The multiply unit may also be configured to refresh the stored reference value by multiplying the stored reference value by an amount based on a comparison of the stored reference value and the fixed reference value. In some embodiments, an accumulator may also be included. For instance, an accumulator block may be included for storing and accumulating input analog signals and output signals from the memory to provide an accumulated analog signal as an output responsive to one or more control signals.

According to some embodiments, a memory array is provided with one or more of the foregoing analog memories and one or more memory cells without a reference component. In such an arrangement, analog values stored in the one or more memory cells may be refreshed based on a threshold comparison of the one or more analog memories.

According to some embodiments, a memory for storing digital and analog values is provided. It may comprise, for instance, a memory management unit and an array comprising a first plurality of memory elements for storing an input analog signal using circuitry suitable for storing an analog value representing the signal, and for transmitting the stored input analog signal as an output analog signal, responsive to a first or second command signal from the memory management unit, respectively. It may further comprise a second plurality of reference memory elements for storing a fixed input analog reference signal using circuitry suitable for storing an analog value, responsive to a first command signal from the memory management unit, as well as at least one threshold sense block for comparing the fixed input analog reference signal and the stored input reference analog signals from the reference memory elements, responsive to the second command signal, and for providing a first signal when the comparison differs by less than a first amount that indicates the output analog signals from the first plurality of memory elements are suitable for further use. The memory may also comprise a plurality of digital memory elements for storing digital inputs and providing them as output digital values in response to command signals from the memory management unit, and a plurality of memory synchronization blocks interconnected with the first plurality of analog memory elements and the plurality of digital memory elements.

According to some embodiments, an analog memory is provided, which comprises at least one memory element for storing an input analog signal using circuitry suitable for storing an analog value representing the signal, and for transmitting the stored input analog signal as an output analog signal, responsive to a first or second control signal, respectively; at least one reference memory element for storing a fixed input analog reference signal using the circuitry suitable for storing an analog value, responsive to the first control signal; and one or more sense block(s) for monitoring at least one of the stored input reference analog signals from the at least one reference memory element for any signal decay, and adjusting the values in the at least one reference memory element and the at least one memory element by an amount to compensate for any decay in the signal stored in the at least one reference memory element.

According to some embodiments, an analog memory cell is provided, which comprises a memory element for storing an input analog signal using circuitry suitable for storing an analog value representing the signal, and for transmitting the stored input analog signal as an output analog signal, responsive to a first or second control signal, respectively; a reference memory element for storing a fixed input analog reference signal using the circuitry suitable for storing an analog value, responsive to the first control signal; and a sense block for monitoring the stored input reference analog signal from the reference memory element for any signal decay, and adjusting the values in the reference memory element and the memory element by an amount necessary to compensate for any decay in the signal stored in the reference memory element.

According to some embodiments, a method for storing an analog input signal is provided. The method may include, for example, simultaneously storing an input analog signal and separately storing a reference analog signal. The method may further include determining the validity of the stored input analog signal for output as a function of the amount of decay of the stored reference analog signal relative to a fixed value.

According to some embodiments, a method for refreshing a stored analog value in an analog memory cell having a reference memory element and an analog memory element is provided. The method may include, for example, monitoring a stored analog reference value in the reference memory element; determining when the stored analog reference value decays to a predetermined threshold value; and restoring the stored analog reference memory value in the reference memory element to its initial stored value. The method may also include restoring the stored analog value in the analog memory element by the same amount or ratio.

According to some embodiments, a method for storing and monitoring an analog signal in a memory is provided. The method may include, for example, responsive to a first signal simultaneously storing an analog signal and an analog reference signal; monitoring the stored analog reference signal for decay; adjusting the stored analog reference signal by an amount or ratio to maintain its value to be the same as when initially stored, and adjusting the stored analog signal by the same amount or ratio used to adjust the stored fixed analog reference signal.

According to some embodiments, a method for storing a sampled analog signal in a memory is provided. The method may include, for example, responsive to a first signal, simultaneously and separately storing the sampled analog signal and an analog reference signal; responsive to a second signal, comparing the stored reference signal to a fixed reference signal; determining the amount of decay of the stored reference signal based at least in part on the fixed reference signal; outputting the stored sampled analog signal; and outputting a valid flag indicator, where the determined amount of decay is less than or equal to a threshold amount.

According to some embodiments, an indicator may indicate validity, degree of validity, and/or lack of validity of stored analog data.

In some embodiments, there is provided an analog memory comprising: a memory element for storing an analog signal using circuitry configured to store a first analog value representing said analog signal, and to transmit said stored analog signal as an output analog signal in response to a first and/or a second control signal; and a reference memory element for storing a preselected analog signal using said circuitry suitable for storing a second analog value in response to said first control signal.

In some embodiments, the analog memory further comprises a sense block for monitoring said stored preselected analog signal from said reference memory element for any signal decay, and adjusting said values in said reference memory element and said memory element by an amount necessary to compensate for any decay in said signal stored in said reference memory element, responsive to a third control signal.

In some embodiments, the analog memory further comprises a first plurality of said memory elements for storing the analog signal, and a first plurality of said reference memory element for storing the preselected analog signal, appropriately interconnected to form an operable analog memory array and responsive to said control signals.

In some embodiments, the analog memory further comprises a plurality of sense blocks for monitoring said stored preselected analog signal from said reference memory elements for any signal decay, and adjusting said values in said reference memory elements and said memory elements by an amount necessary to compensate for any decay in said signal stored in said reference memory elements, responsive to a third control signal.

In some embodiments, there is provided a method for storing an analog signal comprising: simultaneously and separately storing an analog signal and a reference analog signal; and determining a validity of said stored analog signal for output based on an amount of decay of said stored reference analog signal relative to an initial value of said reference analog signal.

In some embodiments, the method further comprises determining when said value of said stored reference analog signal has decayed to a first predetermined threshold value; and restoring said stored reference analog signal and said stored analog signal by a sufficient amount to compensate for the amount of decay in said stored reference analog signal.

In some embodiments, the method further comprises monitoring said stored reference analog signal for decay; and restoring said stored reference analog signal and said stored analog signal when the amount of said decay exceeds a preselected threshold amount.

In some embodiments, the method further comprises monitoring said stored reference analog signal for decay; and providing an output flag indicating said stored analog signal is valid when said monitoring indicates said amount of decay is less than a first threshold amount.

In some embodiments, the method further comprises monitoring said stored reference analog signal for decay; and providing an output flag indicating said stored analog signal is not valid when said monitoring indicates said decay is more than a second threshold amount.

These and other features of the disclosure will become apparent to those skilled in the art from the following detailed description of the disclosure, taken together with the accompanying drawings.

DETAILED DESCRIPTION

Figure 1A:
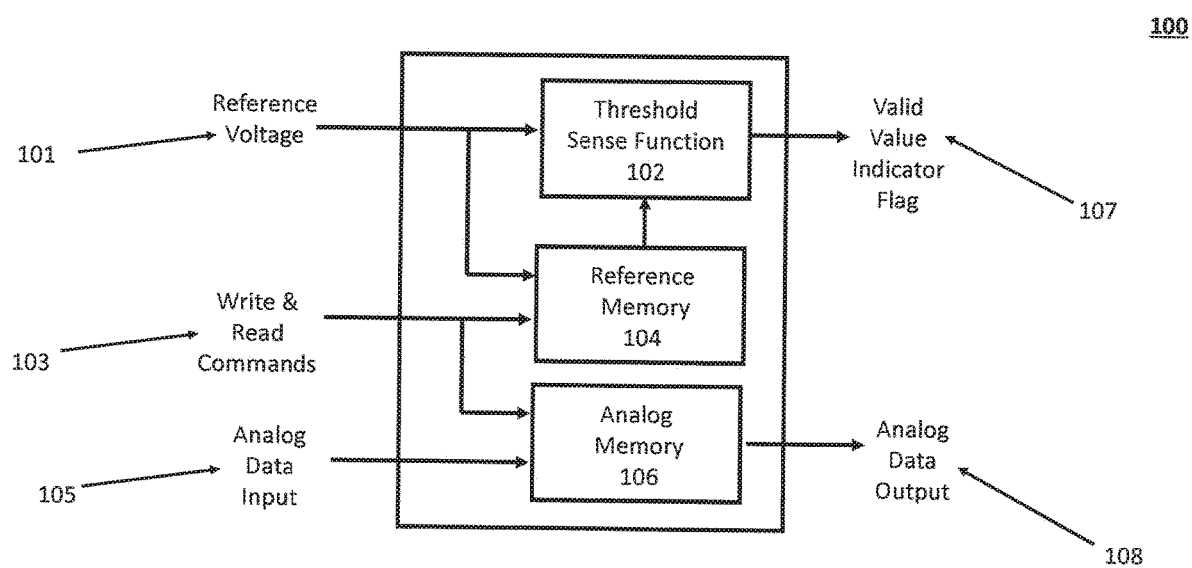
FIG. 1A depicts an analog memory cell according to some embodiments.

Referring now to FIG. 1A, an analog memory cell 100 with a memory value "valid" indicator or flag 107 is provided according to one embodiment. In this embodiment, the memory cell 100 accepts an analog value (or analog word) as a data input 105, which is then stored in an analog memory element 106. This may be, for instance, in response to a write command 103. The write command could be generated by a memory management or controller block. Subsequently, for example, when instructed to do so by a read command 103, the memory cell 100 retrieves the data from the analog memory element 106 and presents the stored analog value or analog word as a data output 108.

In addition to analog memory element 106, the memory cell 100 also contains a reference memory element 104. In some embodiments, the same write command 103 that triggers the analog memory element 106 to accept an input signal of analog data 105, such as an analog "word," and store that input analog data, also triggers the reference memory element 104 to accept and store a fixed reference voltage 101. This fixed reference voltage may be supplied by a predetermined fixed voltage reference selected by a memory management or controller block. A read command 103 may trigger the analog memory element 106 to retrieve the stored analog data and present that data as output data or analog word 108, and trigger the reference memory element 104 to retrieve its stored fixed reference voltage content. The retrieved content (or voltage) may then be presented to a threshold sense function block 102.

As shown in FIG. 1A, the threshold sense function block is provided in some embodiments. The threshold sense function block 102, may for instance, compare the stored fixed reference voltage value from element 104 to the fixed reference voltage 101 to determine the amount of "decay" in the stored voltage versus the fixed reference voltage. In some embodiments, if the amount of decay is less than a fixed amount (e.g., 25%) then the threshold sense function block 102 generates a valid flag 107 to indicate to any follow-on circuitry using the output analog (e.g., word) 108, that the output data 108 is still correct or sufficiently accurate and may be used. In some aspects, if the valid flag 107 is not generated at all, or is indicated to be invalid, all of the follow-on circuitry using the analog output 108 may be notified that this output data 108 is not to be used and/or should be ignored. According to some embodiments, the threshold value may be any predetermined or adaptive value, which the program or a programmer could change either during configuration or during runtime, for example. For instance, the threshold value may be adapted based on 1) accuracy requirements, 2) input or system noise, and/or 3) clocking speeding or slowing of the sample/system clock to include a non-uniform clocking system).

In some embodiments, the circuitry employed for an analog memory element 106 and a reference memory element 104 are identical and/or made up of the same components. For instance, the input and output of any analog data for the memory cell 100 may be bidirectional and take place on a single line rather than using a separate line for data input 105 and a separate line for data output 108, as shown in FIG. 1A. Further, the read and write commands may use separate lines rather than being carried on the same command line 103. Finally the data 105, 108, command 103 may be partially or completely combined into one or more combinations of the same line or lines that may use time division multiplexing, digital encoding, or other means. The combined line may also comprise an address line.

Figure 1B:
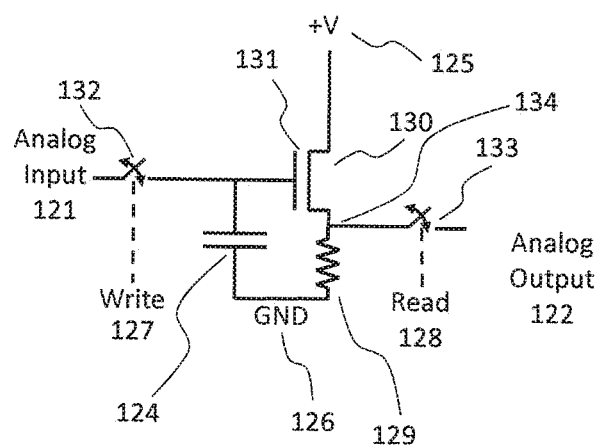
FIG. 1B depicts an analog storage element according to some embodiments.

Referring now to FIG. 1B, an embodiment of an analog storage element 120 is provided. In this embodiment, the element 120 is comprised of a transistor 130 connected to a fixed positive voltage +V 125 and through a resistor 129 to ground 126. In this example, the input to the transistor (i.e., gate 131) is held at a voltage based on the amount of charge stored on the capacitor 124. In some embodiments, during a write cycle a write signal, e.g., from a memory management or controller block, momentarily closes the switch 132 connecting the input analog signal 121 to the capacitor 124 and gate 131 of the transistor 130. In this embodiment, the result of the write cycle is that the transistor 130 is turned on with a voltage on the drain 134 of the transistor 130 representing the analog input 121 and switch 132 is then opened. During a read cycle, switch 133 can be turned on and momentarily driven by a read signal 128 from a memory management or controller block. In some embodiments, the capacitor 124 may be removed and the gate 131 of the transistor 130 may be used by introducing a charge to the now floating gate of the transistor 130. Further, the actual circuitry employed for analog storage element 120 may be modified in a number of ways such as replacing the resistor 129 and transistor 130 with a complementary pair of pnp/npn bipolar or p-channel/n-channel CMOS transistors. The resistor 129 may also be placed on the other side of the read switch 133 to reduce power dissipation in the cell.

Additionally, and in some embodiments, the actual circuitry employed for an analog storage element 120 may also utilize storage of the analog signal as a differential voltage on two elements so that within a certain range of voltage decay, the voltage difference of the voltages on those elements remains constant during decay, thereby providing no decay in the stored signal within that range. The actual circuitry employed for an analog storage element 120 may also utilize a floating gate 131 on transistor 130 or other similar technology suitable to build nonvolatile digital memories such as EPROMS, EEPROMS, or flash memories in order to provide partially or fully nonvolatile analog memory storage.

Figure 1C:
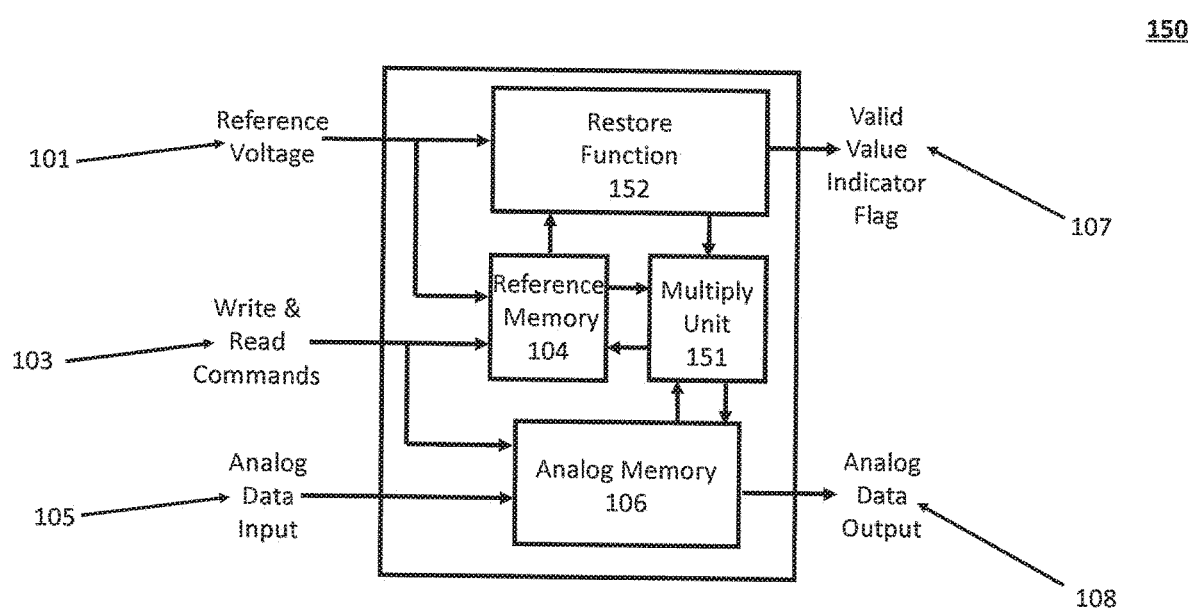
FIG. 1C depicts an analog memory cell according to some embodiments.

Referring now to FIG. 1C, an embodiment of a memory cell 150 is depicted with a restore function 152 (also referred to as a refresh function 152) included along with a valid value indicator flag output 107. In this embodiment, the restore function 152, also referred to as the restore sense function, is an addition to the memory cell depicted in FIG. 1A. In this embodiment, a sense signal is used by the restore function 152 to monitor the decay of the reference analog data word stored in the reference memory 104. When the restore function 152 detects that value of the reference analog word stored in the reference memory 104 decays below a particular value (e.g., a predetermined value), multiply unit 151 multiplies both the analog data (e.g., word) stored in the reference memory 104 and in the analog memory 106 by a value needed to restore the reference analog word stored in the reference memory 104 to its original value, which may be an approximation of the original value in some embodiments. In certain aspects, the value is restored to a reasonable representation of its previous value. The multiply may be based, for instance, on one or more command signals from a memory management or controller block.

In certain aspects, in doing so, the analog data (e.g., word) stored in analog memory 106 is effectively restored. For instance, it can be restored to its original value. According to some embodiments with the restore function, the valid flag output/functional is removed.

In some embodiments, the input and output of the analog data for the memory cell 150 may be bidirectional and take place on a single line rather than using a separate line for data input 105 and a separate line for data output 108, as shown in FIG. 1C. Further, the read and write commands may use separate lines rather than being carried on the same command line 103. Finally the data 105, 108 (e.g., analog data), command 103, and address lines (if any) may be partially or completely combined into one or more combinations of the same line or lines that may use time division multiplexing, digital encoding, or other means.

Figure 2A:
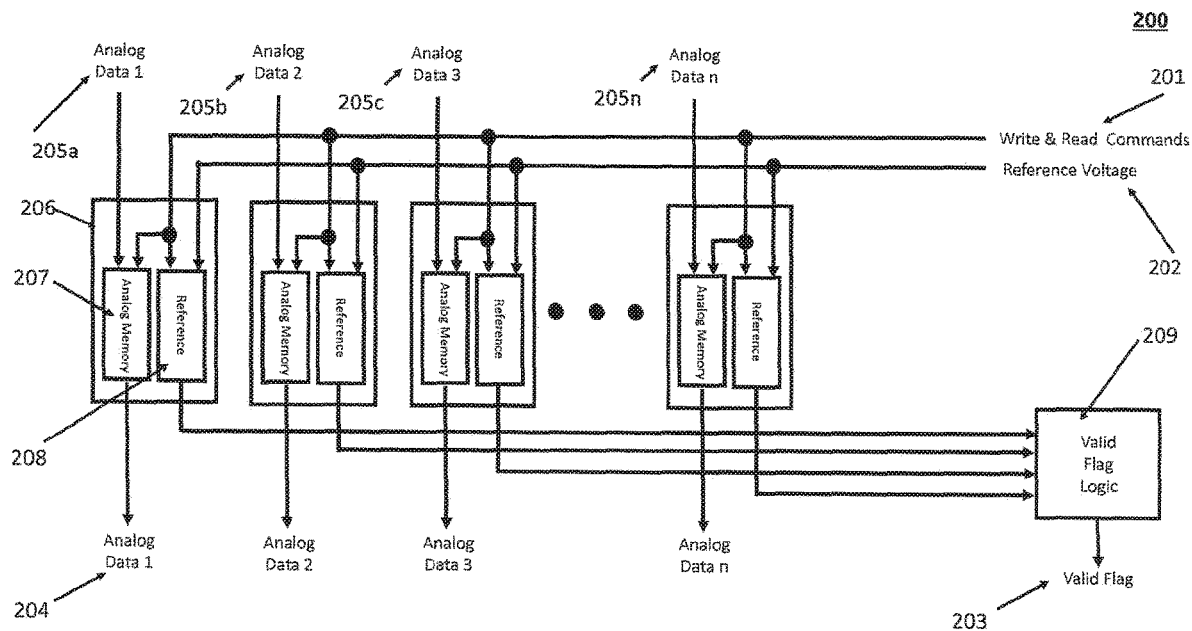
FIGS. 2A and 2B depict an analog memory array with a valid flag according to some embodiments.

FIGS. 2A and B depict embodiments 200, 220, respectively, of an analog memory array for storing analog data (e.g., words) using a valid flag indicator.

Referring now to FIG. 2A, one embodiment of an analog memory array 200 is depicted. It is similar in function to a number of analog memory cells, such as the memory cell 100 of FIG. 1A, being connected in parallel. However for this arrangement, each memory cell 206 contains an analog memory element 207 (also known as an analog word/data) and a reference memory element 208, but the threshold sense function block for all the cells is combined into a single block 209 to generate a single valid flag 203. In some embodiments, each of the memory cells 206 in the memory array 200 performs a write or read operation at the same time to execute a write or read operation in parallel based on command signals from a memory management or controller block, accepting its write analog data to be stored from each of the analog words or data input 205a thru 205n or driving its read analog data to each of their analog word or data output 204, responsive to those commands. Again, the data lines may be bidirectional or a single line rather than using a separate line for data input 205a thru 205n and a separate line for data output 204, as depicted in FIGS. 1A and 1B and FIGS. 2A and 2B. According to some embodiments, each of the memory cells 206 is separately controllable.

Figure 2B:
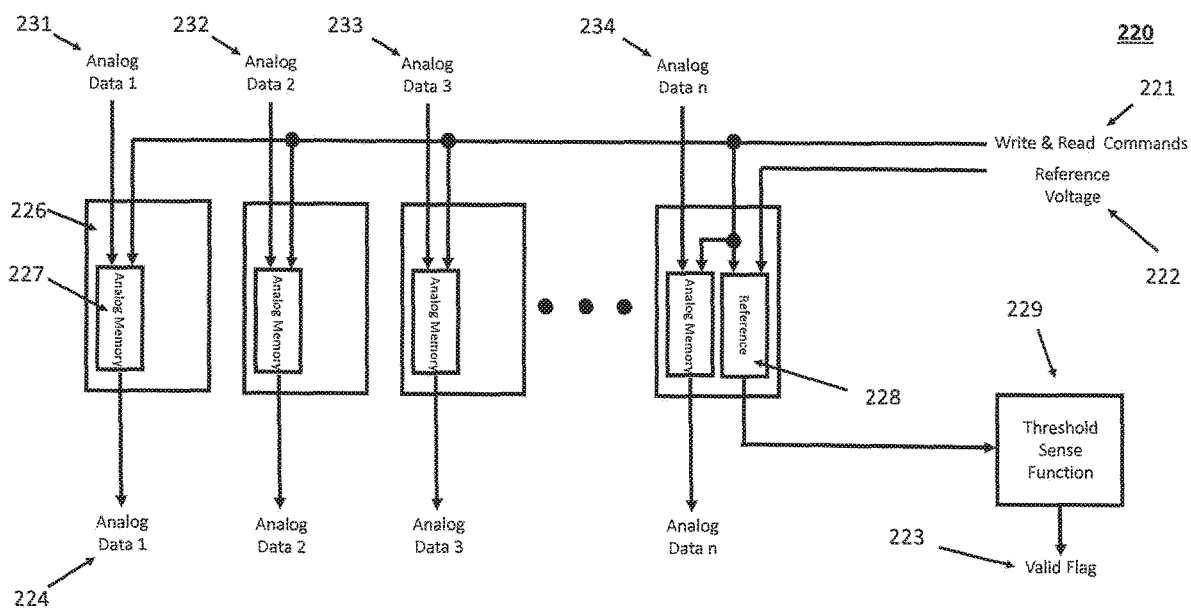

Referring now to FIG. 2B, another embodiment of a memory array is provided. In this embodiment, analog memory array 220 may be used for storing analog data 231, 232, 233, 234, which may each be analog "words," but with a different valid flag indicator 223. In some aspects, it is similar in function to the analog memory array for storing an analog word with valid flag described in FIGS. 1A and 2A. However, in the arrangement or configuration of memory cells 226 of this example, only one of the analog memory cells contains a reference memory element 228. In some embodiments, if the physical circuit implementation for each of the memory cells 226 allows each cell to experience a data decay rate substantially the same in magnitude over time, then the simplification of using only a single reference memory element 228 for the entire memory array 220 may be made. The single reference memory element 228 and/or threshold sensing block 229 may be shared over any number of analog memory cells; for some embodiments the cells may be of one or more different types and/or dual function analog/digital cells. Again, the data lines may be bidirectional or a single line rather than using a separate line for data input 231, 232, 233, 234 and a separate lure for data output 224, as depicted in FIGS. 1A and 1B and FIGS. 2A and 2B.

Figure 3:
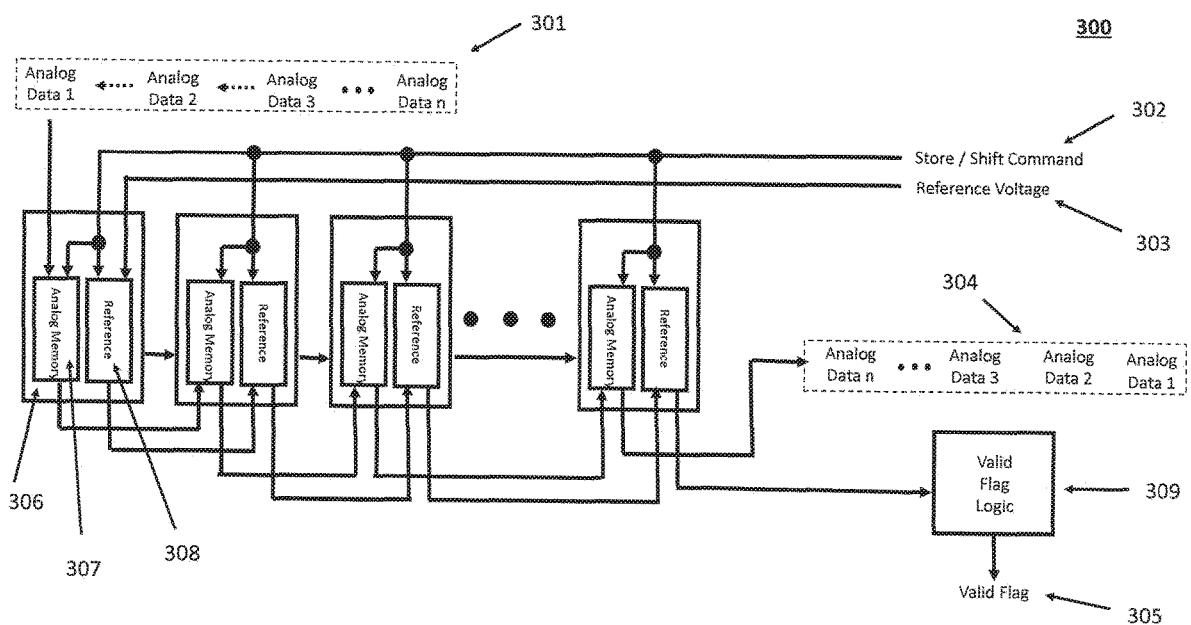
FIG. 3 depicts a bucket brigade analog memory according to some embodiments.

FIG. 3 depicts an embodiment of an analog memory array 300 arranged in a bucket brigade manner with a bucket brigade valid flag 305. In some respects, it is similar in function to a number of analog memory cells (e.g., cells 100 of FIG. 1A) connected in series. For this example arrangement or configuration of memory cells, each memory cell 306 contains an analog memory element 307 and a reference memory element 308, and the threshold sense function block is combined into a single block 309 to generate a single valid flag 305. In some embodiments, each of the memory cells 306 in the memory bucket brigade 300 simultaneously performs the same operation. This may be based on command signals from a memory management or controller block. However, unlike a memory array which can simultaneously accept n analog data inputs (e.g., words) externally for a write/store operation, like those depicted in FIGS.

2A and 2B, or simultaneously driven analog data inputs externally for a read/retrieve operation, like those depicted in FIGS. 2A and 2B, the memory array in a bucket brigade manner accepts (or drives) only a single analog data input (e.g., word) at a time. Moreover, according to some embodiments, there is only a single store/shift command 302, rather than separate write/store and read/retrieve commands from a memory management or controller block. In further embodiments, during each store/shift command, each memory cell 306 simultaneously retrieves its new data word and drives its old data word to the next cell by accepting and storing the new data from the previous memory cell 306. This shifting action is done between the data memory cells 306 and also at the same between the reference memory elements 308. In the illustrated example, only the first reference memory element 308 accepts its input from the fixed reference voltage 303. The store and shift commands may use separate lines rather than being carried on the same command line 302.

Figure 4A:
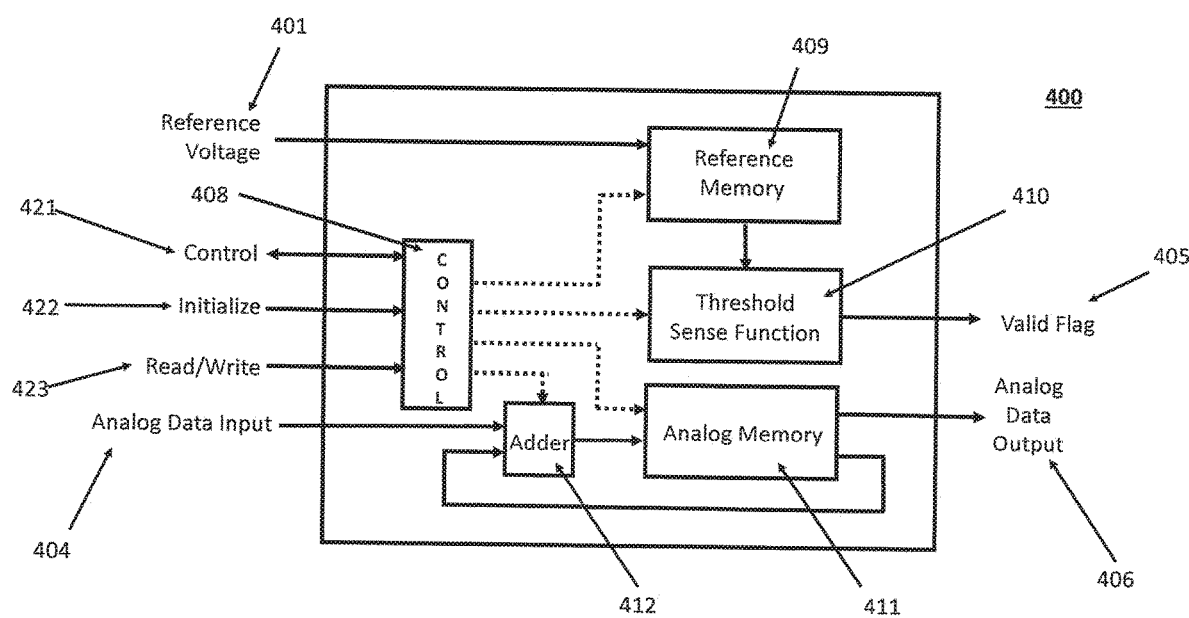
FIGS. 4A and 4B depict an analog memory accumulator according to some embodiments.

FIG. 4A depicts one embodiment of an analog memory accumulator cell 400 that includes a valid flag 405. It is similar in function to an analog memory cell 100 of FIG. 1A, but further provides for a write operation when it stores the new analog word/data. For example, the new analog word/data may be added by the adder 412 to the analog word/data previously stored in analog memory element 411. In this example, in order to support this different functionality, the memory accumulator cell 400 employs an additional initialize command 422 which is used to control reference memory element 409 directly and also to control the analog memory element 411 directly and adder 412 based on command signals from a control block 408, which may be controlled 421 by another memory management or controller block.

According to some embodiments, when the initialize command 422 is asserted simultaneously with the write command 423, the analog memory element 411 with accumulator/adder function 412 operates like the analog memory cell (e.g., memory cell 100 of FIG. 1A) by storing the analog word/data input 404 into the analog memory element 411 while simultaneously storing the reference voltage 401 in the reference memory element 409. In further embodiments, during subsequent write operations occurring without the initialize command 422, the reference memory element 409 is unchanged the analog memory element 411 functions as an adder by storing the new analog word/data input 404 summed with its previous analog word/data output 406. This summing may occur inside the element 411, or may use some additional external logic and provide a loop back from the output to the input portion of element 411 using this external adder logic 412.

According to some embodiments, the read command 423 of the analog memory accumulator 400 functions like that of the analog memory cell 100 of FIG. 1A by retrieving the data from the analog memory element 411 and driving it out to become an analog data output 406. Simultaneously, the reference memory element 409 may retrieve its data and drive or supply it to the threshold sense function block 410 which is used to generate a valid flag 405, when appropriate. In certain aspects, the reference memory element 409 thereby tracks the decay of the primary data over a series of summing writes in the analog memory element 411. In some embodiments, the adder 412 comprises an overflow detector and scaler function which protects the memory cell 411 from being saturated.

According to some embodiments, the input and output of any analog data for a cell 400 may be bidirectional and take place on a single line rather than using a separate line for data input 404 and a separate line for data output 406, as shown in FIG. 4A. Further, the read and write commands may use separate lines rather than being carried on the same command line 423. Finally the data 404, 406, command 423, and any address lines may be partially or completely combined into one or more combinations of the same line or lines that may use time division multiplexing, digital encoding, or other means.

Figure 4B:
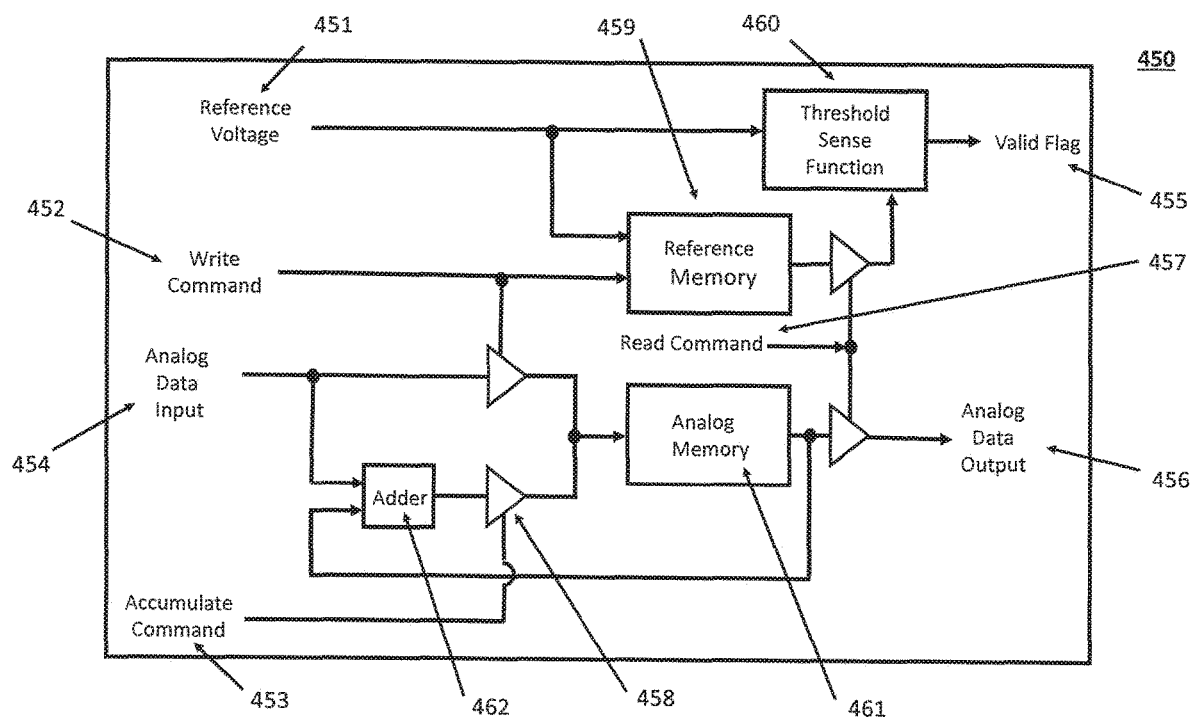

FIG. 4B depicts another embodiment of an analog memory accumulator cell 450 that includes a valid flag 455. It is similar in function to an analog memory cell (e.g., memory cell 100 of FIG. 1A), but further includes an accumulate operation. In certain aspects, when it stores a new analog word/data, the new analog word/data is added by the adder 462 to the analog word/data previously stored in analog memory element 461. In order to support this different functionality, the memory accumulator cell 450 employs a separate write command 452 and accumulate command 453, which are used to control reference memory element 459 directly, and also to control the pass gates 458. This may be based on command signals from a memory management or controller block. In certain aspects, the read and write commands may be carried on the same command line. Finally the data 454, 456, commands 452, 453, 457 and any address lines may be partially or completely combined into one or more core combinations of the same line or lines that may use time division multiplexing, digital encoding, or other means.

In some embodiments, when the write command 452 is asserted, the analog memory element 461 with the top pass gate 458 operates like the analog memory cell 100 of FIG. 1A by storing the analog word/data input 454 into the analog memory element 461 while simultaneously storing the reference voltage 451 in the reference memory element 459. During subsequent accumulate commands, the reference memory element 459 is unchanged while the analog memory element 461 functions as an adder by storing the new analog word/data input 454 summed with its previous analog word/data output 456. This summing may occur inside the analog memory element 461, or may use some additional external logic and provide a loop back from the output to the input portion of analog memory element 461 using this external adder logic 462.

Additionally, the read command 457 of the analog memory accumulator 450 may function like that of the analog memory cell 100 of FIG. 1A by retrieving the data from the analog memory element 461 and driving it out to become an analog data output 456. In this embodiment, simultaneously, the reference memory element 459 retrieves its data and drives or supplies it to the threshold sense function block 460 which is used to output a valid flag 455, when appropriate. The reference memory element 459 thereby tracks the decay of the primary data over a series of summing writes in the analog memory element 461. In some embodiments, the incorporation of an overflow detector and scaler function in the adder 462 will protect the memory cell 461 from being saturated.

According to some embodiments, the refresh capability described with respect to FIG. 1C, e.g., element 150, may be incorporated in the analog memory accumulator cell 400 or 450. In some embodiments, the incorporation of an overflow detector and scaler function in the adder 412 or 462 will protect the memory cell 411 or 461 from being saturated.

Figure 5:
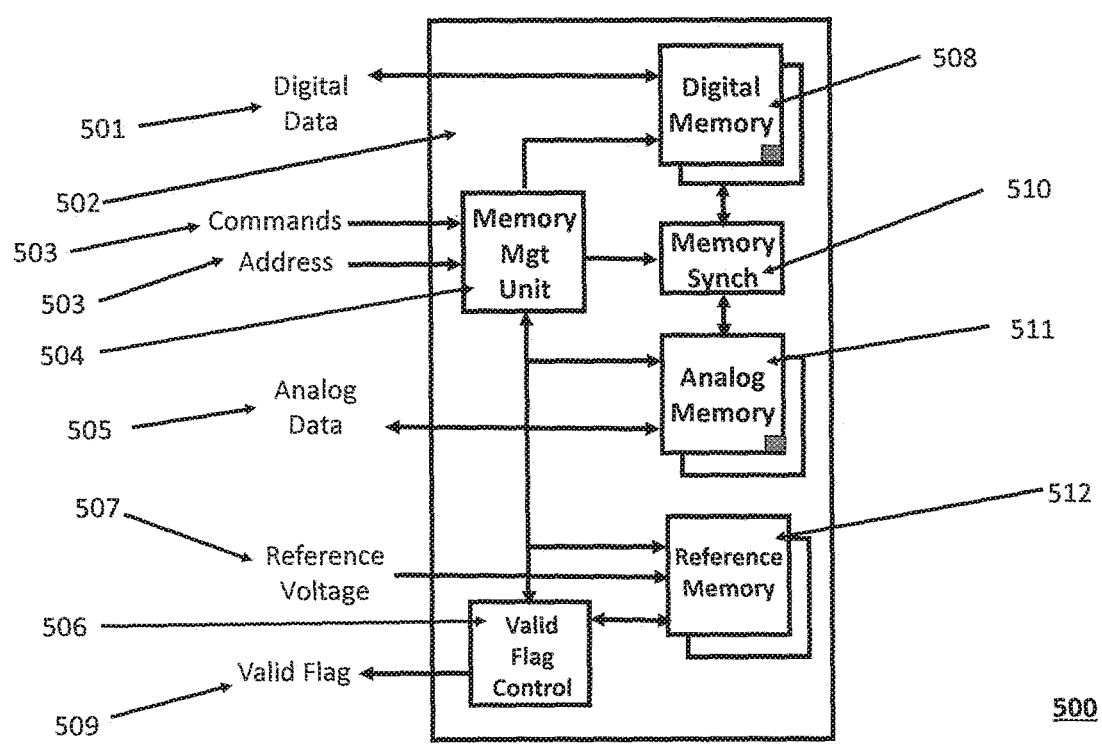
FIG. 5 depicts a dual-representation analog/digital memory with a valid flag according to some embodiments.

Referring now to FIG. 5, a dual-function analog/digital memory 500 with a valid flag 509 according to some embodiments is provided. In some respects, it is similar in function to one or more analog memory cells (e.g., cell 100 of FIG. 1A) combined together with one or more traditional digital memory cells. For example, the analog memory element(s) 511 together with the reference memory element(s) 512 and the valid flag control block (equivalent to a threshold sense function block) 506 may serve the same purposes as in the analog memory cell 102 of FIG. 1A. Additionally, the digital memory element(s) 508 may serve to store the digital equivalent of the analog data which is stored in the analog memory element(s) 511. The memory synchronization block 510 and the memory management unit 504 may provide digital-to-analog and analog-to-digital translations and coordinate the function and commands of the overall dual-function analog/digital memory 500. In some embodiments, the digital data 501 and the analog data 505 may carry digital and analog representations respectively of the same data. Data may be written in digital form and subsequently read and stored in analog form, or written in analog form and subsequently read and stored in digital form. In some embodiments, the reference memory element(s) 512, together with the valid flag control function block 506, serve to monitor the decay of the analog data stored in analog memory element(s) 511. The memory management unit 504 can ensure that the storage of the fixed reference voltage 507 occurs at the correct time. This may be, for example, when analog data 505 is stored or when digital data 501 is translated to analog and then stored. For some embodiments, the output of a valid flag function may be optional. For some embodiments a restore/refresh function may also be employed. For embodiments using this restore/refresh function, the need to output the valid flag function may be optional.

Figure 6:
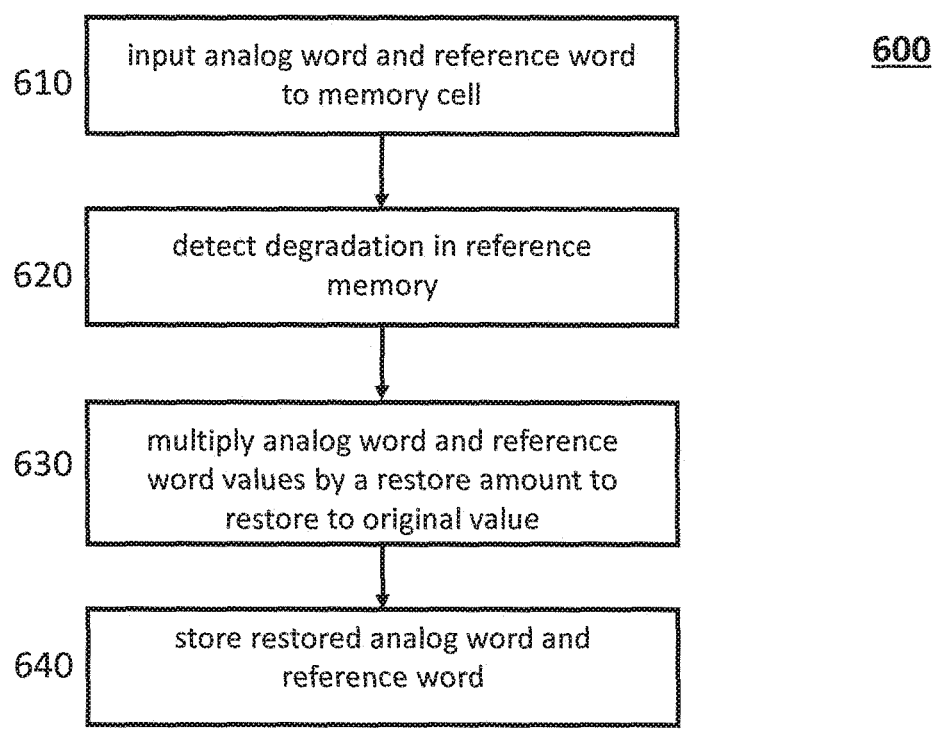
FIG. 6 is a flow chart of a method of restoring an analog word stored in an analog memory according to some embodiments.

Referring now to FIG. 6, a process 600 according to some embodiments is provided. Process 600 may, for instance, restore the value of an analog word to its original value after it has decayed from its original value. The process may be employed, for example, using the arrangement of FIG. 1C. In step 610, an analog word or data input 105 and a reference word 101 are input to a memory cell, such as cell 100 of FIG. 1A, or similar equivalent components of the other FIGS. 2-5. According to some embodiments, the values may be stored simultaneously and separately. Once stored, the restore function, such as 152, monitors 620 the degradation, which can also be referred to as the decay, of the value stored in the reference memory element (e.g., element 104). This may further include determining if the decay is significant enough to affect subsequent processing and/or needs to be restored. This can be based on a comparison to a predetermined level. Once a decay of a certain amount is detected, the analog word/data and/or reference word/data may be adjusted, including multiplied 630 by a restore value (which may be predetermined) to restore them back to their original values. Those restored values may then be stored 640. In certain aspects, the result of this restoration process is not to precisely the same starting value, but rather, is within a reasonable tolerance of the initial starting stored values. In addition, the restoration of the reference word may occur independently and first, before the analog word or data input is adjusted and restored by the same amount.

Figure 7:
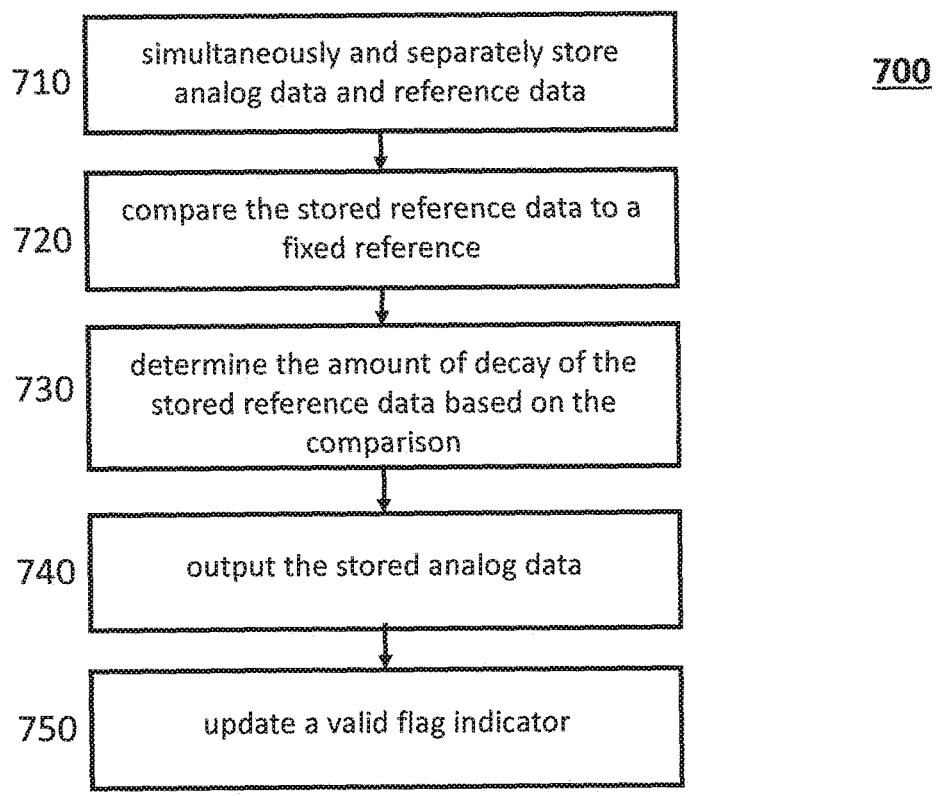
FIG. 7 is a flow chart of a method for storing a signal according to some embodiments.

Referring now to FIG. 7, a process 700 for storing a signal according to some embodiments is provided. In some aspects, process 700 may be used for storing a sampled analog signal in a memory.

In step 710, data, such as from a sampled analog signal, as well as a reference data, such as from an analog reference signal, are simultaneously and separately stored. This may be based on a first signal. In step 720, which may be responsive to a second signal, the stored reference signal is compared to a fixed reference signal. Process 700 may then proceed to step 730, which comprises determining the amount of decay of the stored reference signal based at least in part on the fixed reference signal (i.e., the comparison in step 720). In step 740, the stored data, such as a stored sampled analog signal, is optionally output. In step 750, a valid flag indicator is optionally output, where the determined amount of decay is less than or equal to a threshold amount. According to some embodiments, determining validity may be performed without outputting the value; also, a flag need not always be updated. For instance, a flag may not be needed in embodiments using a refresh function. According to certain aspects, validity may comprise an indication of signal integrity.

According to some embodiments, the determining step 730 is responsive to the first or second signal, while the output step 740 of a stored sampled analog signal is responsive to one or more of the first signal, the second signal, a third signal, or a result of the determining step 730. Additionally, the output of the valid flag indicator step 750 may be responsive to one or more of the first signal, the second signal, a third signal, or a result of the determining step 730. In some embodiments, the threshold amount is dynamically determined as a function of time and an allowable decay value. The threshold amount may also be a predetermined amount.

Figure 8:
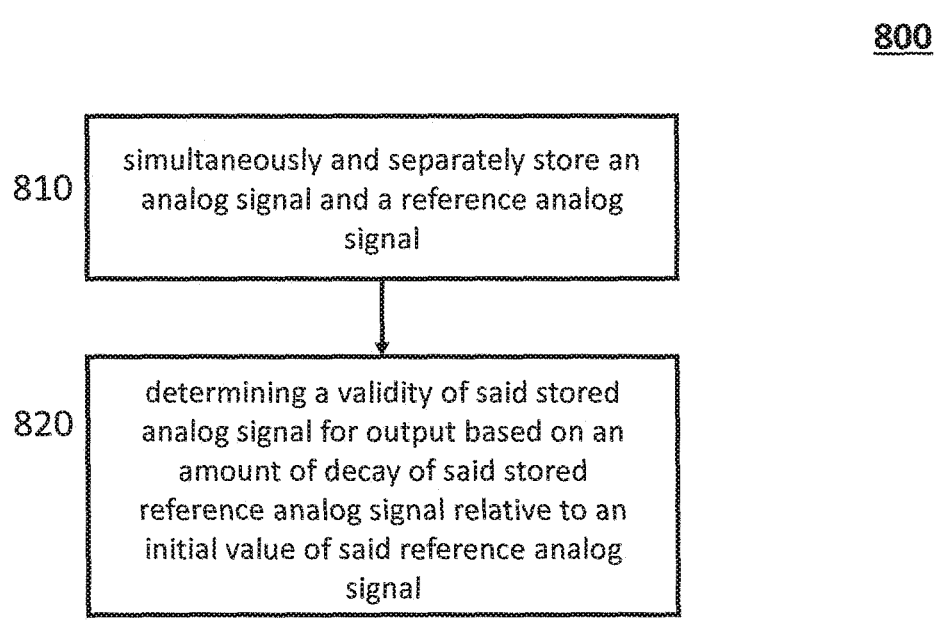
FIG. 8 is a flow chart of a method for storing a signal according to some embodiments.

Referring now to FIG. 8, a process 800 for storing a signal according to some embodiments is provided. In some aspects, process 800 may be used for storing a sampled analog signal in a memory.

In step 810, an analog signal and a reference analog signal are simultaneously and separately stored.

In step, 820, a validity of said stored analog signal for output based on an amount of decay of said stored reference analog signal relative to an initial value of said reference analog signal is determined.

In some embodiments, process 800 further includes determining when said value of said stored reference analog signal has decayed to a first predetermined threshold value; and restoring said stored reference analog signal and said stored analog signal by a sufficient amount to compensate for the amount of decay in said stored reference analog signal.

In some embodiments, process 800 further includes monitoring said stored reference analog signal for decay; and restoring said stored reference analog signal and said stored analog signal when the amount of said decay exceeds a preselected threshold amount.

In some embodiments, process 800 further includes monitoring said stored reference analog signal for decay; and providing an output flag indicating said stored analog signal is valid when said monitoring indicates said amount of decay is less than a first threshold amount.

In some embodiments, process 800 further includes monitoring said stored reference analog signal for decay; and providing an output flag indicating said stored analog signal is not valid when said monitoring indicates said decay is more than a second threshold amount.

Figure 9:
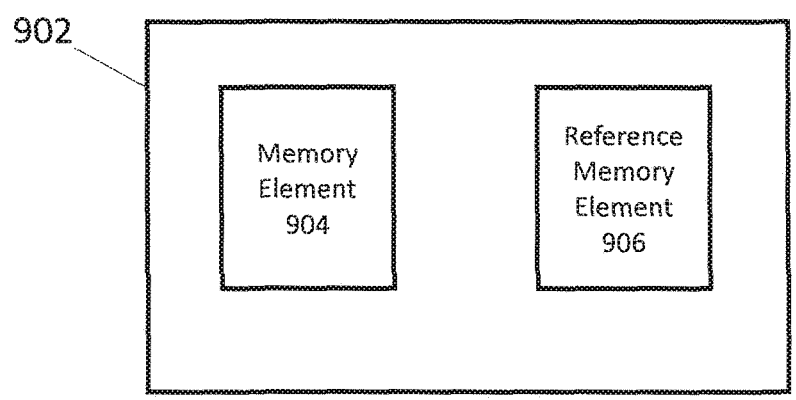
FIG. 9 is a diagram showing functional elements of an analog memory according to some embodiments.

FIG. 9 is a diagram showing functional elements of an analog memory 902 according to some embodiments. As shown in FIG. 9, the analog memory 902 includes a memory element 904 for storing an analog signal using circuitry configured to store a first analog value representing said analog signal, and to transmit said stored analog signal as an output analog signal in response to a first and/or a second control signal; and a reference memory element 906 for storing a preselected analog signal using said circuitry suitable for storing a second analog value in response to said first control signal.

In some embodiments, the analog memory 902 further includes a sense block (e.g., restoring function 152) for monitoring said stored preselected analog signal from said reference memory element for any signal decay, and adjusting said values in said reference memory element and said memory element by an amount necessary to compensate for any decay in said signal stored in said reference memory element, responsive to a third control signal.

In some embodiments, the analog memory 902 further includes a first plurality of said memory elements for storing the analog signal, and a first plurality of said reference memory element for storing the preselected analog signal, appropriately interconnected to form an operable analog memory array and responsive to said control signals.

Figure 10:
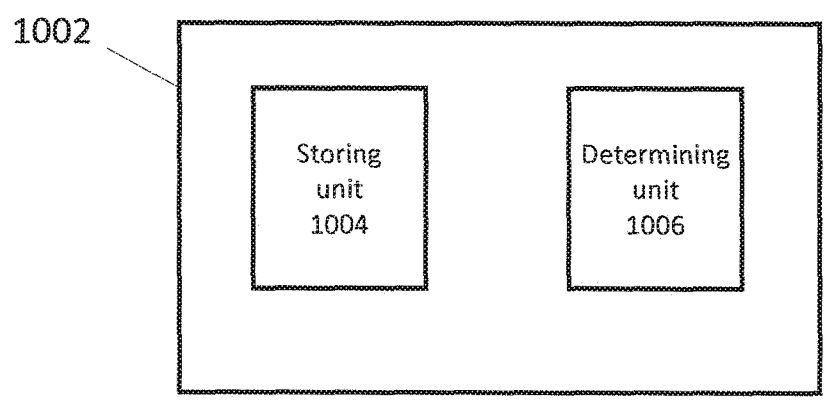
FIG. 10 is a diagram showing functional units of an analog memory according to some embodiments.

In some embodiments, the analog memory 902 further includes a plurality of sense blocks (e.g., restoring function 152) for monitoring said stored preselected analog signal from said reference memory elements for any signal decay, and adjusting said values in said reference memory elements and said memory elements by an amount necessary to compensate for any decay in said signal stored in said reference memory elements, responsive to a third control signal FIG. 10 is a diagram showing functional units of an analog memory 1002 according to some embodiments. As shown in FIG. 10 the analog memory 1002 includes a staring unit 1004 for simultaneously and separately storing an analog signal and a reference analog signal; and a determining unit 1006 for determining a validity of said stored analog signal for output based on an amount of decay of said stored reference analog signal relative to an initial value of said reference analog signal.

In some embodiments, the analog memory 1002 further includes a determining unit for determining when said value of said stored reference analog signal has decayed to a first predetermined threshold value; and a restoring unit for restoring said stored reference analog signal and said stored analog signal by a sufficient amount to compensate for the amount of decay in said stored reference analog signal.

In some embodiments, the analog memory 1002 further includes a monitoring unit for monitoring said stored reference analog signal for decay; and a restoring unit restoring said stored reference analog signal and said stored analog signal when the amount of said decay exceeds a preselected threshold amount.

In some embodiments, the analog memory 1002 further includes a monitoring unit for monitoring said stored reference analog signal for decay; and a providing unit for providing an output flag indicating said stored analog signal is valid when said monitoring indicates said amount of decay is less than a first threshold amount.

In some embodiments, the analog memory 1002 further includes a monitoring unit for monitoring said stored reference analog signal for decay; and a providing unit for providing an output flag indicating said stored analog signal is not valid when said monitoring indicates said decay is more than a second threshold amount.

EXEMPLARY EMBODIMENTS

Aspects of the disclosure are summarized by the following numbered embodiments.

Embodiment 1. An analog memory, comprising:
a first memory element configured to store an analog data value; and
a second memory element configured to store a reference value.

Embodiment 2. The analog memory of embodiment 1, wherein said reference value is an analog reference value stored simultaneously with said analog data value and that indicates decay regarding said data value.

Embodiment 3. The analog memory of embodiment 1 or 2, wherein said analog memory is configured to be a memory cell, memory block, memory bucket-brigade, or memory accumulator.

Embodiment 4. The analog memory of any of embodiments 1-3, wherein said first and second memory elements each comprise circuitry suitable for storing an analog signal.

Embodiment 5. The analog memory of embodiment 4, wherein said analog data value is stored as a voltage in a capacitor.

Embodiment 6. The analog memory of embodiment 4, wherein said analog data value is stored as a charge on a transistor gate.

Embodiment 7. The analog memory of any of embodiments 1-6, further comprising:
one or more threshold sense blocks for comparing said stored reference value and a fixed reference value, wherein said comparison is responsive to a control signal.

Embodiment 8. The analog memory of embodiment 7, wherein said memory is configured to provide an indicator when said comparison differs by less than a first amount,
wherein said indicator is a signal that indicates that the stored data value is suitable for further use.

Embodiment 9. The analog memory of embodiment 7, wherein said memory is configured to provide an indicator when said comparison differs by more than a first amount, wherein said indicator is a signal that indicates that the stored data value is not suitable for further use.

Embodiment 10. The analog memory of embodiment 8 or 9, wherein said first amount is less than or equal to 25%.

Embodiment 11. The analog memory of any of embodiments 1-10, wherein said memory is configured to transmit said stored data value as an analog output signal.

Embodiment 12. The analog memory of any of embodiments 1-11, further comprising: one or more multiply units.

Embodiment 13. The analog memory of embodiment 12, wherein said multiply unit is configured to refresh said stored data value by multiplying said data value by an amount based on a comparison of said stored reference value and said fixed reference value.

Embodiment 14. The analog memory of embodiment 12, wherein said multiply unit is configured to refresh said stored reference value by multiplying said stored reference value by an amount based on a comparison of said stored reference value and said fixed reference value.

Embodiment 15. The analog memory of any of embodiments 1-14, wherein said analog data value is stored responsive to a first control signal, wherein said data value is transmitted responsive to a second control signal, and wherein said reference value is stored responsive to said first control signal.

Embodiment 16. The analog memory of embodiment 15, further comprising:
an accumulator block for storing and accumulating input analog signals and output signals from said memory to provide an accumulated analog signal as an output responsive to said second control signal and a third control signal.

Embodiment 17. A memory array, comprising:

one or more analog memories of any of embodiments 1-16; and one or more memory cells without a reference component, wherein said array is arranged such that analog values stored in said one or more memory cells may be refreshed based on a threshold comparison of said one or more analog memories of any of embodiments 1-16.

Embodiment 18. A memory for storing digital and analog values, comprising:

a memory management unit, an array comprising a first plurality of memory elements for storing an input analog signal using circuitry suitable for storing an analog value representing the signal, and for transmitting said stored input analog signal as an output analog signal, responsive to a first or second command signal from said memory management unit, respectively, a second plurality of reference memory elements for storing a fixed input analog reference signal using said circuitry suitable for storing an analog value, responsive to said first command signal from said memory management unit, at least one threshold sense block for comparing said fixed input analog reference signal and said stored input reference analog signals from said reference memory elements, responsive to said second command signal, and providing a first signal when said comparison differs by less than a first amount that indicates the output analog signals from said first plurality of memory elements are suitable for further use, a plurality of digital memory elements for storing digital inputs and providing them as output digital values in response to command signals from said memory management unit, and a plurality of memory synchronization blocks interconnected with said first plurality of analog memory elements and said plurality of digital memory elements.

Embodiment 19. An analog memory, comprising:

at least one memory element for storing an input analog signal using circuitry suitable for storing an analog value representing the signal, and for transmitting said stored input analog signal as an output analog signal, responsive to a first or second control signal, respectively, at least one reference memory element for storing a fixed input analog reference signal using said circuitry suitable for storing an analog value, responsive to said first control signal, and one or more sense block(s) for monitoring at least one of said stored input reference analog signals from said at least one reference memory element for any signal decay, and adjusting the values in said at least one reference memory element and said at least one memory element by an amount to compensate for any decay in said signal stored in said at least one reference memory element.

Embodiment 20. An analog memory cell, comprising:

a memory element for storing an input analog signal using circuitry suitable for storing an analog value representing the signal, and for transmitting said stored input analog signal as an output analog signal, responsive to a first or second control signal, respectively, a reference memory element for storing a fixed input analog reference signal using said circuitry suitable for storing an analog value, responsive to said first control signal, and a sense block for monitoring said stored input reference analog signal from said reference memory element for any signal decay, and adjusting the values in said reference memory element and said memory element by an amount necessary to compensate for any decay in said signal stored in said reference memory element.

Embodiment 21. A method for storing an input analog signal, comprising:

simultaneously storing an input analog signal and separately storing a reference analog signal, and determining the validity of said stored input analog signal for output as a function of the amount of decay of said stored reference analog signal relative to a fixed value.

Embodiment 22. A method for refreshing a stored analog value in an analog memory cell having a reference memory element and an analog memory element, comprising:

monitoring a stored analog reference value in said reference memory element, determining when said stored analog reference value decays to a predetermined threshold value, restoring the stored analog reference memory value in said reference memory element to its initial stored value and restoring said stored analog value in said analog memory element by the same amount or ratio.

Embodiment 23. A method for storing and monitoring an analog signal in a memory, comprising:

responsive to a first signal simultaneously storing an analog signal and an analog reference signal, monitoring said stored analog reference signal for decay, adjusting said stored analog reference signal by an amount or ratio to maintain its value to be the same as when initially stored, and adjusting said stored analog signal by the same amount or ratio used to adjust said stored fixed analog reference signal.

Embodiment 24. A method for storing a sampled analog signal in a memory, comprising:

responsive to a first signal, simultaneously and separately storing said sampled analog signal and an analog reference signal;

responsive to a second signal, comparing said stored reference signal to a fixed reference signal;

determining the amount of decay of said stored reference signal based at least in part on said fixed reference signal;

outputting said stored sampled analog signal; and outputting a valid flag indicator, wherein said determined amount of decay is less than or equal to a threshold amount.

Embodiment 25. The method of embodiment 24, wherein said determining is responsive to said first or second signal, wherein said outputting the stored sampled analog signal is responsive to one or more of said first signal, said second signal, a third signal, or a result of said determining, and wherein said outputting the valid flag indicator is responsive to one or more of said first signal, said second signal, a third signal, or a result of said determining.

Embodiment 26. The method of embodiment 24 or 25, wherein said threshold amount is dynamically determined as a function of time and an allowable decay value.

Embodiment 27. The method of embodiment 24 or 25, wherein said threshold amount is a predetermined amount.

While various embodiments of the present disclosure are described herein, it should be understood that they have been presented by way of example only, and not limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the concepts, functions and processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. An analog memory, comprising:
at least one memory element configured to (i) store an analog signal by storing a first analog signal value representing said analog signal and (ii) output said stored analog signal as an output analog signal, wherein the storing and/or the outputting is performed in response to one or more of a first control signal and a second control signal;
at least one reference memory element configured to store a preselected fixed analog signal by storing a second analog signal value representing the preselected fixed analog signal in response to said first control signal; and
at least one sense block for comparing said second analog signal value stored in said reference memory element to a fixed reference value,
wherein the comparison is made in response to a triggering condition,
wherein said analog memory is configured to provide an indicator when said comparison differs by less than a first amount, and
wherein said indicator is a signal that indicates that data stored in the memory element is suitable for further use.

2. The analog memory of claim 1, wherein:
the at least one sense block is configured to (i) monitor and detect any change in the second analog signal value stored in said reference memory element and (ii) adjust a changed second analog signal value stored in said reference memory element and a changed first analog signal value stored in said memory element by an amount necessary to compensate for the detected change in response to a third control signal.

3. The analog memory of claim 1, wherein:
said at least one memory element comprises a first plurality of said memory elements for storing the analog signal, and
said at least one reference memory element comprises a first plurality of said reference memory elements for storing the preselected fixed analog signal.

4. The analog memory of claim 1, wherein:
said at least one sense block comprises a plurality of sense blocks configured to (i) monitor and detect any change in the second analog signal value stored in said reference memory elements and (ii) adjust the second analog signal value stored in said reference memory elements and the first analog signal value stored in said memory elements by an amount necessary to compensate for the detected change in response to a third control signal.

5. The analog memory of claim 1, wherein the first analog signal value and/or the second analog signal value is stored as a voltage in a capacitor or in a transistor.

6. The analog memory of claim 1, wherein
said analog memory is configured to provide an indicator when said comparison differs by more than or equal to a first amount, and
said indicator is a signal that indicates that data stored in the memory element is not suitable for further use.

7. The analog memory of claim 1, wherein the first amount is less than or equal to 25%.

8. The analog memory of claim 1, wherein said analog memory is configured to transmit the stored analog signal as an analog output signal.

9. The analog memory of claim 1, wherein
the first analog signal value is changed to a third analog signal value,
the second analog signal value is changed to a fourth analog signal value,
one or more multiplying units are connected to the memory element and the reference memory element, and
said one or more multiplying units are configured to change the third analog signal value and/or the fourth analog signal value by multiplying the third analog signal value and/or the fourth analog signal value by an amount which is based on a comparison of the fourth analog signal value and a fixed reference value.

10. The analog memory of claim 1, wherein
the first analog signal value is stored in the memory element in response to the first control signal,
the first analog signal value is changed to a third analog signal value, and
the third analog signal value is outputted from the memory element in response to the second control signal.

11. The analog memory of claim 1, further comprising:
an accumulator block which is configured to, responsive to a third control signal, store and accumulate input analog signals, wherein
said memory elements are configured to provide an accumulated analog signal as an output, and
the outputting of the signals from the memory element is performed in response to said second control signal.

12. A memory for storing digital and analog values, comprising:
a memory management unit,
an array comprising a first plurality of memory elements each for storing an input analog signal by storing an analog value representing the input analog signal, and for outputting said stored input analog signal as an output analog signal, wherein the storing is performed in response to a first command signal from said memory management unit and the outputting is performed in response to a second command signal from said memory management unit,
a second plurality of reference memory elements each configured to store a fixed input analog reference signal by storing an analog value in response to said first command signal from said memory management unit,
at least one threshold sense block configured to compare said fixed input analog reference signal and said stored input reference analog signals from said reference memory elements, responsive to said second command signal, and providing a first signal when said comparison differs by less than a first amount that indicates the output analog signals from said first plurality of memory elements are suitable for further use,
a plurality of digital memory elements for storing digital inputs and providing them as output digital values in response to command signals from said memory management unit, and
a plurality of memory synchronization blocks interconnected with said first plurality of analog memory elements and said plurality of digital memory elements.

13. An analog memory, comprising:
at least one memory element configured to (i) store an analog signal by storing a first analog signal value representing said analog signal and (ii) output said stored analog signal as an output analog signal, wherein the storing is performed in response to a first control signal and the outputting is performed in response to a second control signal;
at least one reference memory element configured to store a preselected fixed analog signal by storing a second analog signal value representing the preselected fixed analog signal in response to said first control signal; and
one or more sense blocks configured to (i) monitor and detect any change in the second analog signal value stored in said reference memory element and (ii) adjust a changed second analog signal value stored in said reference memory element and a changed first analog signal value stored in said memory element by an amount necessary to compensate for the detected change in response to a third control signal,
wherein said one or more sense blocks are configured to compare said second analog signal value stored in said reference memory element to a fixed reference value,
wherein the comparison is made in response to a triggering condition,
wherein said analog memory is configured to provide a first indicator when said comparison differs by less than a first amount, and said first indicator is a signal that indicates that data stored in the memory element is suitable for further use,
wherein said analog memory is configured to provide a second indicator when said comparison differs by more than or equal to the first amount, and said second indicator is a signal that indicates that data stored in the memory element is not suitable for further use.

* * * * *